United States Patent [19]

Bergero et al.

[11] 4,270,100
[45] May 26, 1981

[54] MICROWAVE ACOUSTIC WAVE OSCILLATOR

[75] Inventors: Jean-Pierre Bergero; Yves Charlet; Philippe Leschaeve, all of Paris, France

[73] Assignee: Thomson-CSF, Paris, France

[21] Appl. No.: 29,271

[22] Filed: Apr. 12, 1979

[30] Foreign Application Priority Data

Apr. 18, 1978 [FR] France .................................. 78 11314

[51] Int. Cl.³ ............................................. H03B 3/06
[52] U.S. Cl. ................................. 331/107 A; 331/41; 331/107 R
[58] Field of Search ................. 331/107 A, 107 R, 37, 331/40, 41–43, 176

[56] References Cited

U.S. PATENT DOCUMENTS

| 3,889,205 | 6/1975 | Mitchell | 331/107 A |
| 4,100,511 | 7/1978 | Wisbey | 331/107 A |

Primary Examiner—David K. Moore
Attorney, Agent, or Firm—Roland Plottel

[57] ABSTRACT

The microwave oscillator is formed by a free oscillator 1 coupled with two surface or volume acoustic wave delay lines 9 and 10 connected in series or in parallel and operating by reflection. The first line imposes a delay $2\tau_1$, corresponding to one reciprocation, which is a multiple of the delay $2\tau_2$ imposed by the second line, and $a = \tau_1/\tau_2$ is preferably equal to 2 or 3. Application to oscillators operating at ultra-high frequencies, particularly in the L-band.

7 Claims, 7 Drawing Figures

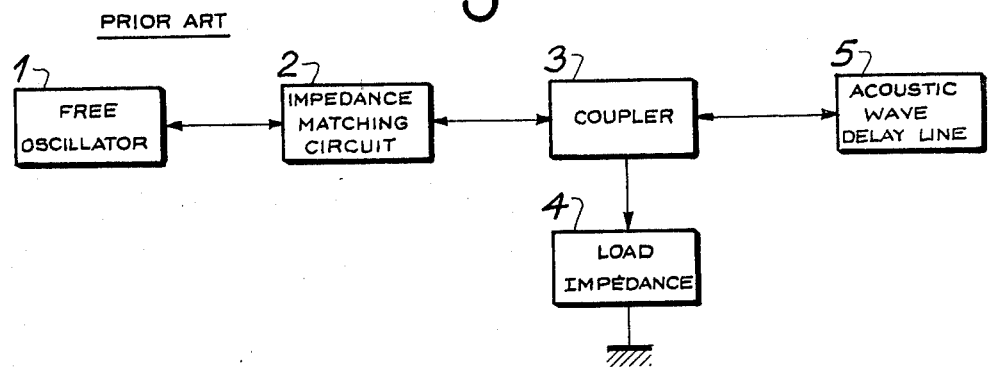
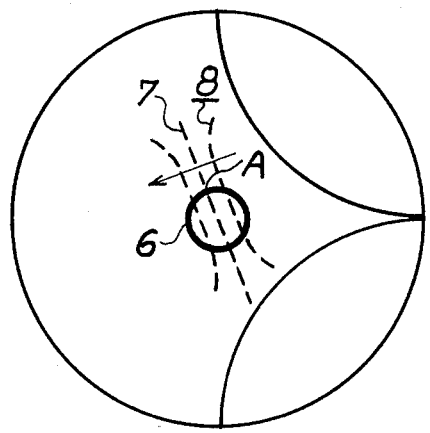
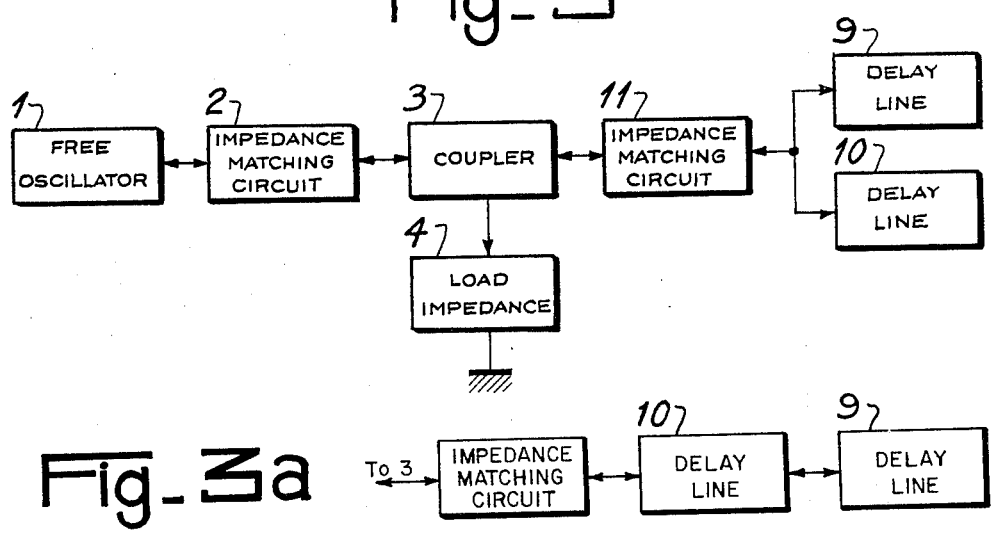

Fig_4
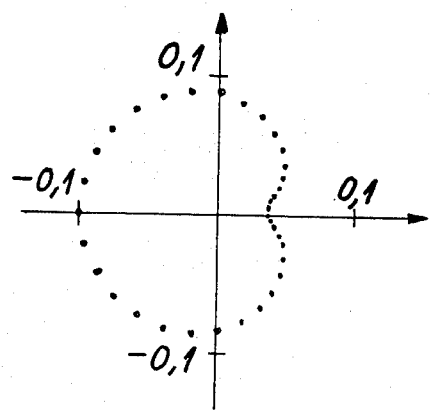
Fig_5
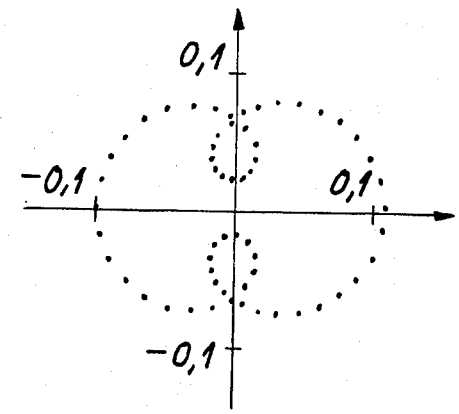
Fig_6
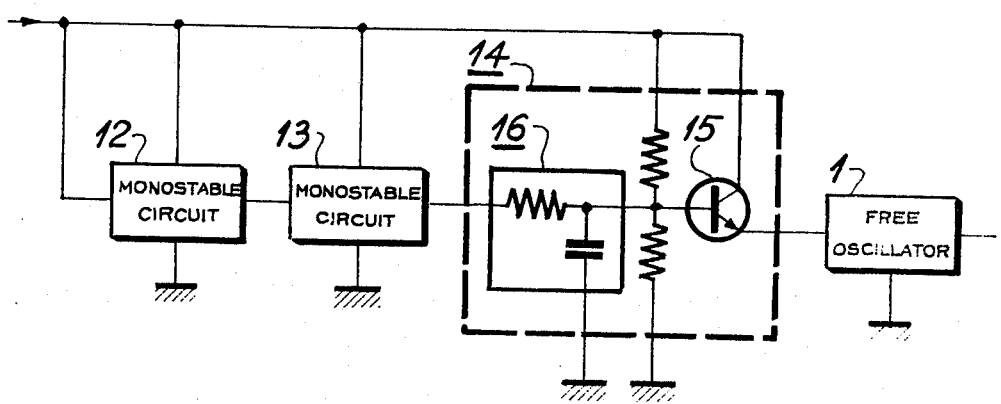

MICROWAVE ACOUSTIC WAVE OSCILLATOR

This invention relates to a microwave oscillator utilising the propagation of acoustic waves in delay lines operating by reflection.

It is known from the prior art that a microwave oscillator can be produced by coupling a free oscillator, formed by an active quadripole connected to two passive networks such that this system enters into oscillation, with an acoustic wave-delay line operating by reflection which stabilizes the frequency of the free oscillator.

An oscillator of the type in question is capable of operating at ultra-high frequencies and, more particularly, in the L band. In this frequency range, technological problems are involved in the production of electromechanical transducers of the interdigital comb type for surface wave delay lines and it is only volume wave delay lines, which use different transducers, that can be used on an industrial scale. Volume wave delay lines also have the advantage of ensuring better thermal stability than surface wave delay lines.

The acoustic wave delay line operating by reflection only stabilizes the frequency of the free oscillator if the signals reflected by this delay line are in phase which the signals coming from the free oscillator.

Since the delay corresponding to one reciprocation on the delay line is equal to $2\tau$, the frequencies of the free oscillator at which stability is obtained are multiples of $1/2\tau$ and are expressed thus: $F = k.f = K/2\tau$, where k is a positive integer. These frequencies represent the modes of operation of the microwave oscillator which are thus separated by a frequency band equal to $1/2\tau$.

The delay line has an impedence variable as a function of frequency and the frequency of the free oscillator varies as a function of the load connected to it (Pulling effect). Thus, the association of these two effects enables the frequency of the free oscillator to be locked for a single mode of operation.

The problem which then arises is reproducibly to select a single mode of operation of the microwave acoustic wave oscillator. This is because, when it is started up, the free oscillator supplies a frequency varying over a fairly wide band. Accordingly, it is possible for the free oscillator to stabilize for a mode of operation different from the mode of operation selected.

If the delay $2\tau$ corresponding to one reciprocation on the delay line is reduced, the frequency band $1/2\tau$ separating two successive modes of operation increases, which contributes towards the selection of a single mode of operation, although at the same time the overvoltage coefficient Q of the microwave oscillator and, hence, its short-term stability, $\Delta F/F$ per second, are reduced which is a disadvantage.

The present invention relates to an acoustic wave oscillator capable of operating at ultra-high frequencies, particularly in the L band, of which a single mode of operation may be reproducibly selected without reducing the overvoltage coefficient and, hence, the short-term stability of the oscillator for the working point selected.

The microwave oscillator according to the invention comprises a free oscillator coupled with two acoustic wave delay lines connected in series or in parallel and operating by reflection. The first line imposes a delay $2\tau_1$, corresponding to one reciprocation, sufficient to obtain a high short-term stability for the working point selected, the second line imposes a delay $2\tau_2$, corresponding to one reciprocation, which is a sub-multiple of the delay imposed by the first line, enabling the frequency band separating two successive modes of operation to be brought to $1/2\tau_2 = a/2\tau_1$, which contributes towards reproducibly selecting a single mode of operation.

The microwave oscillator according to the invention also comprises means for starting up the feed of the free oscillator in three stages; these means enable the band of frequencies supplied by the free oscillator when it is started up to be reproducibly reduced and, hence, also contribute toward reproducibly selecting a single mode of operation.

Other aspects, features and results of the invention will become apparent from the following description given by way of non-limiting example in conjunction with the accompanying drawings, wherein:

FIG. 1 is a basic diagram of an oscillator corresponding to the prior art.

FIG. 2 is a diagram enabling the working point of the oscillator shown in FIG. 1 to be determined.

FIG. 3 shows one particular embodiment of an oscillator according to the invention.

FIG. 3a shows an alternative embodiment similar to FIG. 3.

FIGS. 4 and 5 are diagrams showing the variation in the coefficient of reflection of the delay line as a function of the frequency.

FIG. 6 diagrammatically illustrates one particular embodiment of the means for starting up the feed of the free oscillator according to the invention.

In these various Figures, the same references denote the same elements.

FIG. 1 is a basic diagram of a microwave oscillator corresponding to the prior art. This oscillator comprises a free oscillator 1 formed, as mentioned above, by an active quadripole, for example a microwave transistor, connected at its input and output to two passive networks. The output network comprises an impedance matching circuit 2 and coupler 3 connected unidirectionally to the load impedance 4 and bidirectionally to an acoustic wave delay line 5 which operates by reflection. The input network establishes the oscillation conditions.

FIG. 2 is a diagram enabling the working point of the oscillator shown in FIG. 1 to be determined.

On the Smith abacus shown in thin lines in FIG. 2, the variation in the coefficient of reflection of the delay line 5 as a function of the frequency is represented in thick lines by a series of concentric circles corresponding to the equation $A.e^{-j.2\tau.\omega}$, where A is a constant and $\omega$ is the pulsation of the free oscillator. This representation is valid in approximate terms, particularly in the case of a frequency variation $\Delta F$ around the frequency F of the ultra-high-frequency oscillator such that $\Delta F/F \leq 0.01$.

Also shown in chain lines on the Smith abacus is the Rieke diagram 8 which represents the frequency evolution of the free oscillator. The Rieke diagram is made up of isofrequencies, the various points of an isofrequency corresponding to the various loads which have to be connected to the output of the free oscillator for it to operate at a constant frequency.

Since the influence of the load 4 is considered to be negligible, the working point of the microwave oscillator is the point of intersection of the circle 6 and the isofrequency 7 corresponding to one mode of operation, the only stable working point A being that for which the frequency variations on the circle 6 and the Rieke diagram are oppositely directed.

The modes of operation are separated by a frequency band equal to $1/2\tau$ which is small by comparison with the frequency F of the microwave oscillator. On the other hand, the impedance of the delay line is substantially periodic with a period of $1/2\tau$. The microwave oscillator may thus stabilize for a mode of operation difference from the mode of operation selected.

If the delay $2\tau$ due to one reciprocation on the delay line is reduced, the frequency band $1/2\tau$ separating two successive modes is increased, which contributes towards the selection of a single mode of operation, although at the same time the impedance variation corresponding to one and the same frequency variation is reduced, which corresponds to a reduction in the overvoltage coefficient Q of the ultra-high-frequency oscillator and hence to a reduction in its short-term stability $\Delta F/F$ per second.

In the same way as before, the acoustic-wave microwave oscillator according to the invention comprises a free oscillator formed by an active quadripole connected to two passive networks such that this system enters into oscillation. This free oscillator is coupled with two acoustic wave delay lines which are operating by reflection and reproducibly select a single mode of operation.

The modes of operation of the microwave oscillator being the frequencies at which the microwave signal coming from the free oscillator is in phase with the signal reflected by the acoustic wave delay lines.

The first line imposes for one reciprocation a delay $2\tau_1$ sufficient to obtain a high overvoltage coefficient and, hence, high short-term stability of the microwave oscillator at certain points of the band of frequencies separating two modes of operation, from which points the working point will be selected.

The second line imposes for one reciprocation a delay $2\tau_2$ which is a sub-multiple of the delay imposed by the first line, enabling the frequency band separating two successive modes of operation to be brought to $1/2\tau_2 = a/2\tau_1$.

The two acoustic wave delay lines are connected in series or in parallel. They may be surface or volume acoustic wave delay lines.

For one reciprocation, the first line imposes a delay $2\tau_1$ sufficient to obtain a high overvoltage coefficient and, hence, a high short-term stability of the microwave oscillator at certain points of the frequency band separating two successive modes of operation, from which points the working point will be selected.

For one reciprocation, the second line imposes a delay $2\tau_2$ which is a sub-multiple of the delay imposed by the first line, thus enabling the frequency band separating two successive modes of operation to be brought to $1/2\tau_2 = a/2\tau_1$, $a = \tau_1/\tau_2$ preferably being equal to 2 or 3.

FIG. 3 shows one particular embodiment of an oscillator according to the invention. Two delay lines 9 and 10, for example of the acoustic volume wave type, are connected in parallel and separated from the coupler 3 by an impedance matching circuit 11, their delays $\tau_1$ and $\tau_2$ being such that $\tau_1/\tau_2 = a$, a being a positive integer greater than 1.

FIG. 3a is similar to FIG. 3 but shows the delay lines 9 and 10 connected in series. The circuit drawing is otherwise the same as that of FIG. 3. and therefore the complete circuit is not repeated.

FIGS. 4 and 5 show two diagrams illustrating the variation in the coefficient of reflection of the delay line as a function of the frequency in the case where $a = \tau_1/\tau_2 = 2$ and in the case where $a = 3$. In FIG. 4, two delay lines $\tau_1 = 1$ $\mu$s and $\tau_2 = 0.5$ $\mu$s are used whilst, in FIG. 5, two delay lines $\tau_1 = 1$ $\mu$s and $\tau_2 = 0.33$ $\mu$s are used. In both cases, the mode of operation selected is F = 1500 MHz, the frequency band separating two successive modes being $1/2\tau_1$, i.e. 1 MHz and 1.5 MHz, respectively.

The frequencies are calibrated by using a discontinuous representation of the coefficient of reflection. In both cases, a frequency band of 25 KHz separates two consecutive points of these diagrams.

It can be seen from these diagrams that the impedance variation corresponding to one and the same frequency variation is not constant, as is the case when a single line is used, so that the overvoltage coefficient and the short-term stability vary as a function of the frequency. Accordingly, it is sufficient to fix the working point in the zone where this impedance variation is at its greatest.

The amplitude of the reflection coefficient is not constant and varies periodically, depending on whether the signals coming from the two lines are in phase or out of phase.

The microwave acoustic-wave oscillator according to the invention also comprises means for starting un the feed of the free oscillator in three stages:
the free oscillator is first fed for a period sufficient to enable the active quadripole which it comprises to reach its operating temperature;
the feed is then interrupted for a period short enough to prevent the active quadripole from cooling, but long enough to allow relaxation of the microwave oscillator;
feeding of the free oscillator is then resumed, the transient variation in the feed voltage from OV to the operating value taking place with a steep slope and being reproducible.

This starting up of the free oscillator makes it possible to reduce the band of frequencies supplied by the oscillator on start-up and renders it reproducible.

The means for starting un the free oscillator thus contribute towards reproducibly selecting a single mode of operation.

FIG. 6 is a circuit diagram of one particular embodiment of the means for starting up the free oscillator. Two monostable circuits 12 and 13, for example of the TTL-type, are used. These monostable circuits are used to work out the periods corresponding to the first two stages of the starting up of the feed of the free oscillator.

Means 14 enable the free oscillator 1 to be fed with a clearly defined, reproducible transient variation in the feed voltage. The means 14 may be formed by a power transistor 15 and an RC circuit 16 intended to establish a clearly defined reproducible transient variation in the feed voltage of the free oscillator.

What we claim is:
1. A microwave acoustic wave oscillator which comprises:
a free oscillator formed by an active quadripole connected to two passive networks such that this system enters into oscillation;
two acoustic wave delay lines coupled to the free oscillator which are operating by reflection and reproducibly select a single mode of operation, the modes of operation of the microwave oscillator being the frequencies at which the microwave signal coming from the free oscillator is in phase with the signal reflected by the acoustic wave delay lines, the first line imposing for one reciprocation a delay $2\tau_1$ sufficient to obtain a high overvoltage coefficient and, hence, high short-term stability of the microwave oscillator at certain points of the band of frequencies separating two successive modes of operation, from which points the working point will be selected, and the second line imposing for one reciprocation a delay $2\tau_2$ which is a sub-multiple of the delay imposed by the first line, enabling the frequency band separating two successive modes of operation to be brought to $1/2\tau_2 = a/2\tau_1$, where a is integer greater than 1.

2. An oscillator according to claim 1, wherein the two acoustic wave delay lines are connected in series.

3. An oscillator according to claim 1, wherein the two acoustic wave delay lines consist of two surface acoustic wave delay lines.

4. An oscillator according to claim 1, wherein $a = \tau 1/\tau 2$ is equal to 2 or 3.

5. An oscillator according to claim 1, which comprises means for starting up the feed of the free oscillator in accordance with the following three stages:
the free oscillator is fed for a period sufficient to enable the active quadripole which it comprises to reach its operating temperature;
the feed is interrupted for a period short enough to prevent the active quadripole from cooling, but long enough to allow relaxation of the microwave oscillator;
feeding of the free oscillator is resumed, the transient variation in the feed voltage from OV to the operating value taking place with a steep slope and being reproducible.

6. An oscillator according to claim 1 wherein the two acoustic wave delay lines are connected in parallel.

7. An oscillator according to claim 1, wherein the two acoustic wave delay lines consist of two volume acoustic wave delay lines.

* * * * *